United States Patent
Garrett

(10) Patent No.: US 9,431,902 B2
(45) Date of Patent: Aug. 30, 2016

(54) SENSORLESS CURRENT SENSE FOR REGULATING INDUCTOR CURRENT IN A BUCK CONVERTER

(71) Applicant: Fairchild Semiconductor Corporation, San Jose, CA (US)

(72) Inventor: James Garrett, Nashua, NH (US)

(73) Assignee: Fairchild Semiconductor Corporation, Sunnyvale, CA (US)

( * ) Notice: Subject to any disclaimer, the term of this patent is extended or adjusted under 35 U.S.C. 154(b) by 314 days.

(21) Appl. No.: 14/018,847

(22) Filed: Sep. 5, 2013

(65) Prior Publication Data

US 2014/0062440 A1    Mar. 6, 2014

Related U.S. Application Data

(60) Provisional application No. 61/696,907, filed on Sep. 5, 2012.

(51) Int. Cl.
*H02M 3/156* (2006.01)
*H02M 1/00* (2006.01)
*G01R 19/00* (2006.01)

(52) U.S. Cl.
CPC .......... *H02M 3/156* (2013.01); *G01R 19/0092* (2013.01); *H02M 2001/0009* (2013.01); *H02M 2001/0045* (2013.01)

(58) Field of Classification Search
CPC .......... G05F 1/46; H02M 1/32; H02M 1/156

USPC ........................................ 323/350, 268, 284
See application file for complete search history.

(56) References Cited

U.S. PATENT DOCUMENTS

| | | | |
|---|---|---|---|
| 7,701,181 B2* | 4/2010 | Inoue | 323/268 |
| 7,764,054 B1* | 7/2010 | Guo et al. | 323/224 |
| 8,760,134 B2* | 6/2014 | Garrett | 323/282 |
| 8,988,054 B2* | 3/2015 | Marty | 323/273 |
| 2012/0153913 A1* | 6/2012 | Wan et al. | 323/282 |
| 2012/0293144 A1* | 11/2012 | Chang | H02M 3/1588 323/271 |
| 2014/0002047 A1* | 1/2014 | Houston | H02M 3/156 323/283 |
| 2015/0333611 A1* | 11/2015 | Lakkimsetti | H02M 1/00 323/271 |
| 2015/0372594 A1* | 12/2015 | Mednik | H02M 3/158 323/299 |

* cited by examiner

*Primary Examiner* — Gary L Laxton
*Assistant Examiner* — Kyle J Moody
(74) *Attorney, Agent, or Firm* — Grossman Tucker Perreault & Pfleger PLLC

(57) ABSTRACT

A device and method for sensing an inductor current in an inductor is provided that generates a voltage signal proportionate to the inductor current if the inductor is connected to a positive supply and simulates the inductor current if the inductor is not connected to the positive supply. The voltage signal may be generated by sampling an input voltage from the inductor onto a capacitor if the inductor is connected to the positive supply. The inductor current may be simulated by generating a simulation current and pushing the simulation current onto the capacitor.

16 Claims, 3 Drawing Sheets

SENSORLESS CURRENT SENSE FOR REGULATING INDUCTOR CURRENT IN A BUCK CONVERTER

CROSS REFERENCE TO RELATED APPLICATION

This application claims the benefit of U.S. Provisional Patent Application Ser. No. 61/696,907, filed Sep. 5, 2012.

FIELD

The present disclosure relates to sensorless current sense for regulating inductor current, and more particularly, to sensorless current sense for regulating inductor current in a Buck converter.

BACKGROUND

As mobile electronics become smaller, inductors selected for the mobile electronics are also becoming smaller. Inductor current capabilities are therefore reduced and inductor currents need to be monitored closely. Sensing inductor current is typically done with a sense element in order to receive instantaneous information about the inductor current. However, a sense element adds complexity and requires additional space. In addition, measuring an average inductor current requires an RC filter, which adds long delays, or an analog to digital converter (ADC), which is only capable of receiving information with a delay of at least one cycle.

BRIEF DESCRIPTION OF THE DRAWINGS

Features and advantages of the claimed subject matter will be apparent from the following detailed description of some example embodiments consistent therewith, which description should be considered with reference to the accompanying drawings, wherein:

Although the following Detailed Description will proceed with reference being made to some illustrative example embodiments, many alternatives, modifications, and variations thereof will be apparent to those skilled in the art.

DETAILED DESCRIPTION

Generally, the present disclosure describes devices and/or methods for sensing an inductor current without a sensor in order to regulate the inductor current. In some example embodiments, the present disclosure describes devices and/or methods for sensing the inductor current without a sensor in order to regulate the inductor current in a Buck converter.

Figure 1:
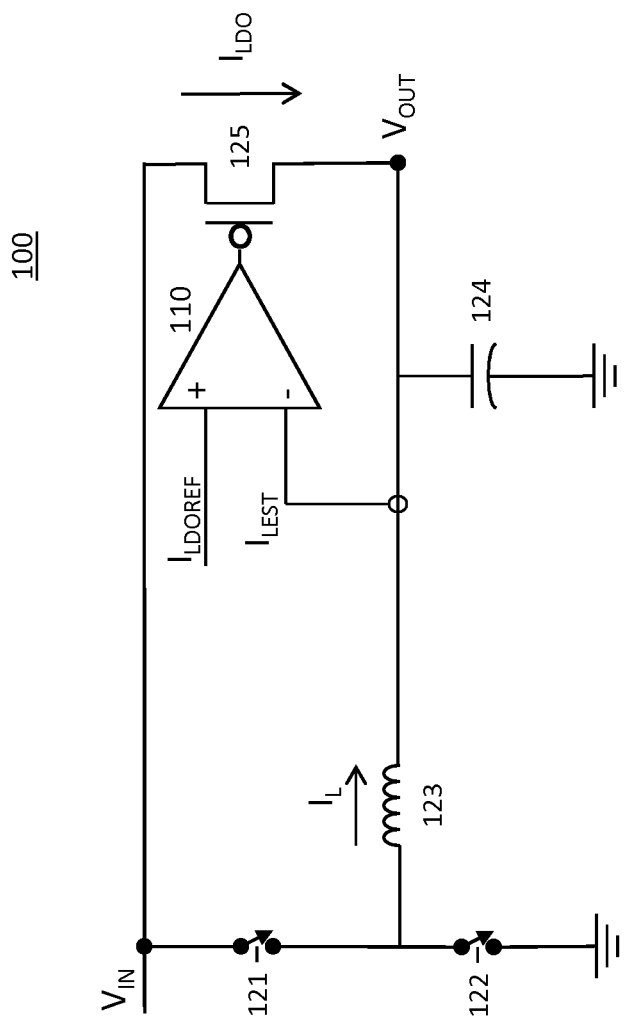
FIG. 1 illustrates a simplified diagram of a current bypass circuit according to some example embodiments.

FIG. 1 illustrates a simplified diagram of a current bypass circuit 100 according to some example embodiments. The current bypass circuit 100 may include an op amp 110, a high switch 121, a low switch 122, an output inductor 123, an output capacitor 124 and a voltage controlled current source 125, for example, a P-type metal-oxide-semiconductor (PMOS) field-effect transistor (FET).

The current bypass circuit 100 in some example embodiments may regulate an inductor current ($I_L$) in the output inductor 123 by measuring the inductor current ($I_L$) or generating an estimated current ($I_{LEST}$) and comparing the estimated current ($I_{LEST}$) to a reference current ($I_{LDOREF}$) at the op amp 110. The op amp may then attempt to force $I_{LEST}$ to be equal to $I_{LDOREF}$ by modulating the voltage on the voltage controlled current source 125 until equilibrium is reached. At this point $I_{LEST}$ will equal $I_{LDOREF}$ and $I_{LDO}$ will provide the remaining current to the output load to maintain the desired output voltage. Thus, the inductor current ($I_L$) may be regulated at the reference current ($I_{LDOREF}$), with all additional current being provided by the low drop-out current ($I_{LDO}$).

Figure 2:
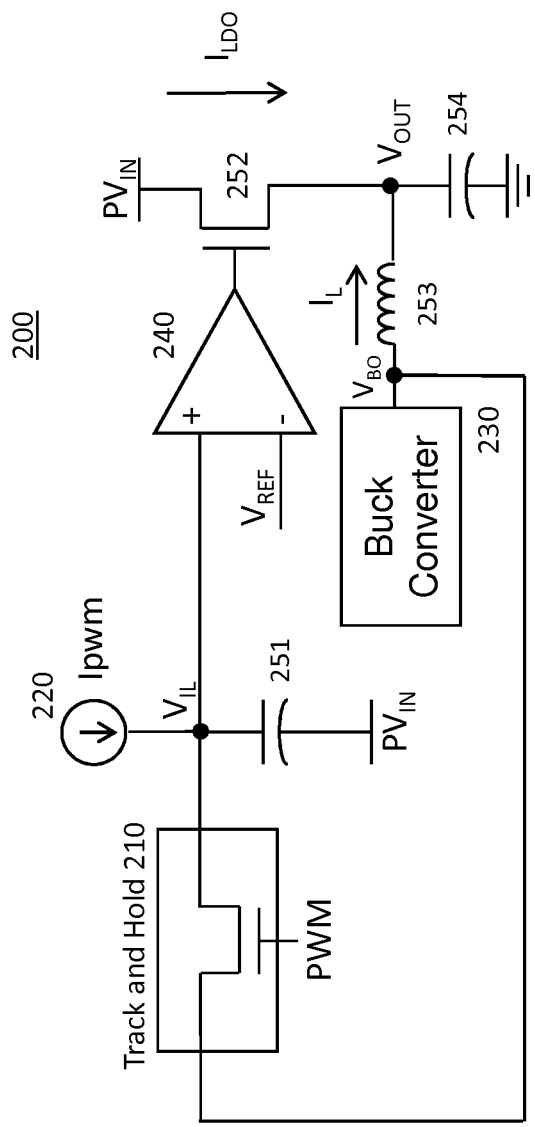
FIG. 2 illustrates a circuit diagram of a sensorless control circuitry according to some example embodiments.

FIG. 2 illustrates a circuit diagram of a sensorless control circuitry 200 according to some example embodiments. The sensorless control circuitry 200 may include a track and hold circuitry 210, a current source 220, a buck converter 230, an op amp 240, a first capacitor 251, a voltage controlled current source 252, an output inductor 253 and an output capacitor 254.

In some example embodiments, the sensorless control circuitry 200 may operate in one of two states. During an on-time of the buck converter 230, also known as an on-time state for the sensorless control circuitry, a pulse width modulated (PWM) signal to the track and hold circuitry 210 may turn the track and hold circuitry 210 on so that the output of the buck converter 230 may be connected to the positive terminal of the op amp 240. Thus, during the on-time state, an op amp input voltage ($V_{IL}$) at the positive terminal of the op amp 240 may be equal to a buck output voltage ($V_{BO}$) at the output inductor 253. During an off-time of the buck converter 230, also known as an off-time state for the sensorless control circuitry 200, the PWM signal to the track and hold circuitry 210 may turn the track and hold circuitry 210 off so that the output of the buck converter 230 may not be connected to the op amp 240 and $V_{IL} \neq V_{BO}$. A more detailed description of these two states is provided below.

Figure 3:
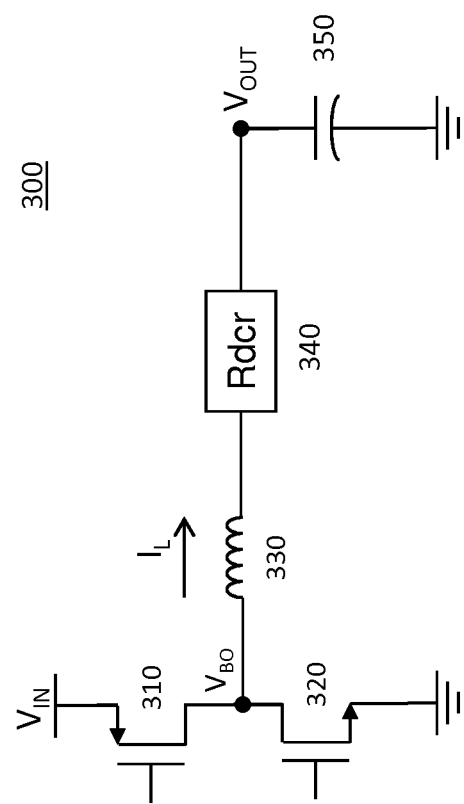
FIG. 3 illustrates a simplified diagram of an output stage according to some example embodiments.

FIG. 3 illustrates a simplified diagram of an output stage 300 according to some example embodiments. The output stage 300 may include an input voltage ($V_{in}$) connected to a high switch 310 and ground (GND) connected to a low switch 320. A buck output voltage ($V_{BO}$), between the high switch 310 and the low switch 320 of the output stage 300, is the voltage at the input to an output inductor 330. The output inductor 330 can be modeled as an inductor 330 and a parasitic resistance (Rdcr) 340, and is connected to an output capacitor 350.

Referring to FIGS. 2-3, the on-time of the buck converter 230 may occur when the high switch 310 is on and the low switch 320 is off so that the inductor is connected to a positive supply. During the on-time state, the op amp input voltage ($V_{IL}$) at the positive terminal of the op amp 240 may be equal to the buck output voltage ($V_{BO}$) because the track and hold circuit 210 is on and the positive supply is being sampled onto the capacitor. Therefore, $$V_{IL} = V_{BO} = V_{in} - I_L * R_{ds(on)} \quad (1)$$

where Vin is the input voltage to the output stage 300 illustrated in FIG. 3 (typically a positive supply rail), $I_L$ is the inductor current of the output inductor 330 and $R_{ds(on)}$ is the resistance of the high switch 310 in the output stage 300. Thus, during the on-time state, the comparator input voltage ($V_{IL}$) may be an instantaneous voltage representation that is proportional to the inductor current ($I_L$) of the output inductor 330. Equation 2 below is derived from equation 1.

$$dV_{IL}/dt = dV_{BO}/dt = -dI_L/dt * R_{ds(on)} \quad (2)$$

The off-time of the buck converter 230 may occur when the high switch 310 is off and the low switch 320 is on so that the inductor is not connected to a positive supply. During the off-time state, the op amp input voltage ($V_{IL}$) at the positive terminal of the op amp 240 may not be connected to the buck output voltage ($V_{BO}$) as the track and hold circuitry 210 is open. Instead, the current source 220 and the first capacitor 251 may simulate the inductor current ($I_L$) of the output inductor 253. For example, if the current source 220 is generated correctly, the op amp input voltage ($V_{IL}$) will be proportional to the inductor current ($I_L$) of the output inductor 253 with the same proportionality constant as during the on-time state.

For the op amp input voltage ($V_{IL}$) to have the same proportionality constant as during the on-time state, $dV_{IL}/dt$(off-time) should follow the inductor current ($I_L$) during the off-time with the same proportionality constant. Thus, $$dV_{IL}/dt(\text{off-time}) = -dI_L/dt(\text{off-time})*R_{ds(on)} \qquad (3)$$

However, during the off-time state, $V_{IL}$ may be governed by:

$$I = C*dV/dt \qquad (4)$$

Therefore, $$I_{off} = C_{251}*dV_{IL}/dt \qquad (5)$$

$$I_{off} = C_{251}*(-dI_L/dt*R_{ds(on)}) \qquad (6)$$

The law of inductors is:

$$V = L*dI_L/dt \qquad (7)$$

During the off-time state, the voltage at the output inductor 330 is:

$$V = (-I_L*R_{ds(off)}) - (\text{Vout} + I_L*R_{dcr}) \qquad *8)$$

Thus, using the law of inductors, $$\therefore dI_L/dt = ((-I_L*R_{ds(off)}) - (\text{Vout} + I_L*R_{dcr}))/L \qquad (9)$$

$$\therefore I_{off} = C_{251}*R_{ds(on)}*(I_L*R_{ds(off)} + \text{Vout} + I_L*R_{dcr})/L \qquad (10)$$

$$I_{off} = k*R_{ds(on)}*\text{Vout} + k*R_{ds(on)}*I_L*(R_{ds(off)} + R_{dcr}) \qquad (11)$$

where k is a natural number indicating a constant coefficient, $I_L$ is a constant used to approximate an average inductor current, $R_{ds(off)}$ is the resistance of the low switch 320 in the output stage 300 and Rdcr is a DC resistance value of the inductor. For example, $I_L$ may be determined based on the previous average current in the inductor. However, example embodiments may vary and $I_L$ may be dynamically determined based off of the output voltage ($V_{OUT}$) or $I_L$ may vary depending on temperature and process. In addition, k may be a ratio of an internal capacitance to an external inductance, but example embodiments may vary and are not limited thereto.

In addition, $k*R_{ds(on)}*I_L*(R_{ds(off)} + R_{dcr})$ from equation (11) may be approximated with a constant. Therefore, equation (11) may be approximated as:

$$I_{off} = k*R_{ds(on)}*\text{Vout} + c \qquad (12)$$

where c is a natural number indicating a constant based on typical values for $R_{ds(on)}$, $R_{ds(off)}$ and Rdcr.

For the op amp input voltage ($V_{IL}$) to have the same proportionality constant during the off-time state as during the on-time state, the current source 220 may generate a simulation current according to equations (11) or (12), such that Ipwm is equal to $I_{toff}$. This simulation current may be pushed onto the first capacitor 251 so that the voltage at the positive terminal of the op amp 240 may simulate the inductor current. However, example embodiments may vary and the simulation current may for example be pulled off of the first capacitor 251 instead.

In some example embodiments, the current source 220 may generate the simulation current according to equation (11) or equation (12) at all times. For example, as the track and hold circuitry 210 is on during the on-time state, the simulation current generated by the current source 220 may cause a small voltage drop across the track and hold circuitry 210, but it should be negligible compared to the signal coming through the track and hold circuitry 210. However, example embodiments may vary and the current generator 220 may be turned off during the on-time state or may generate the simulation current according to equation (11) or (12) only during the off-time of the buck converter 230.

Similar to the op amp 110 illustrated in FIG. 1, the op amp 240 may attempt to make the input voltage ($V_{IL}$), which is a voltage representation of the inductor current ($I_L$), equal to a reference voltage ($V_{REF}$) by modulating the voltage controlled current source 252. The op amp 240 may attempt to force $V_{IL}$ to be equal to $V_{REF}$ by modulating the voltage on the voltage controlled current source 252 until equilibrium is reached. At this point $V_{IL}$ will equal $V_{REF}$ and $I_{LDO}$ will provide the remaining current to the output load to maintain the desired output voltage. Thus, the inductor current ($I_L$) may be regulated by the reference voltage ($V_{REF}$), with all additional current being provided by the voltage controlled current source 252 and the power supply pin $PV_{IN}$, which is a power supply pin capable of generating the additional current.

The current source 220 may include a voltage to current converter (not shown). In order to make $I_{toff}$ proportional to $V_{OUT}$, the voltage to current converter may include a resistor string with $V_{OUT}$ as the input. In order to make $I_{toff}$ proportional to $R_{DS(on)}$ of the high switch 310 illustrated in FIG. 3, the resistor string may include a metal-oxide-semiconductor field-effect transistor (MOSFET) at the bottom of the resistor string with the same characteristics as the high switch 310. Thus, the resistor string may include fixed resistors and a linear field-effect transistor (FET) resistor whose resistance mirrors $R_{DS(on)}$ from the high switch 310. However, example embodiments may vary and are not limited thereto.

Example embodiments provide a sensorless current sense for regulating inductor current.

According to some example embodiments, there is provided a method for sensing an inductor current in an inductor, the method including generating a voltage signal proportionate to the inductor current if the inductor is connected to a positive supply; and simulating the inductor current if the inductor is not connected to the positive supply.

In some example embodiments, generating the voltage may include sampling an input voltage from the inductor onto a capacitor if the inductor is connected to the positive supply.

In some example embodiments, simulating the inductor current may include generating a simulation current; and pushing the simulation current onto the capacitor.

In some example embodiments, the simulation current may have a proportionality constant equal to a proportionality constant of the voltage signal.

In some example embodiments, the method may include comparing a voltage at the capacitor to a reference voltage.

In some example embodiments, the method may further include connecting a positive supply to an output node if the voltage at the capacitor is greater than the reference voltage.

In some example embodiments, the inductor current may be regulated if the positive supply is connected to the output node.

In some example embodiments, the generating may generate a current according to I=k*Rds(on)*Vout+c where k is a constant, Rds(on) is a resistance of a switch connecting the inductor to the positive supply, Vout is an output voltage, and c is a constant.

In some example embodiments, c may be calculated according to c=k*Rds(on)*IL*(Rds(off)+Rdcr) where IL is a constant approximating an average inductor current, Rds(off) is a resistance of a switch connecting the inductor to one of ground and a negative supply, and Rdcr is a DC resistance value of the inductor.

In some example embodiments, k may be a ratio of an internal capacitance of a device to an external inductance.

According to some example embodiments, there is provided a device for sensing an inductor current in an inductor, the device including a first circuitry configured to generate a voltage signal proportionate to the inductor current if the inductor is connected to a positive supply; and a second circuitry configured to simulate the inductor current if the inductor is not connected to the positive supply.

In some example embodiments, the first circuitry may be configured to sample an input voltage from the inductor onto a capacitor if the inductor is connected to the positive supply in order to generate the voltage signal.

In some example embodiments, the second circuitry may be configured to generate a simulation current and push the simulation current onto the capacitor in order to simulate the inductor current.

In some example embodiments, the simulation current may have a proportionality constant equal to a proportionality constant of the voltage signal.

In some example embodiments, the device may include an op amp configured to compare a voltage at the capacitor to a reference voltage.

In some example embodiments, the op amp may be configured to connect a positive supply to an output node if the voltage at the capacitor is greater than the reference voltage.

In some example embodiments, the inductor current may be regulated if the op amp connects the positive supply to the output node.

In some example embodiments, the simulation current may be generated according to I=k*Rds(on)*Vout+c, where k is a constant, Rds(on) is a resistance of a switch connecting the inductor to the positive supply, Vout is an output voltage, and c is a constant.

In some example embodiments, c may be calculated according to c=k*Rds(on)*IL*(Rds(off)+Rdcr), where IL is a constant approximating an average inductor current, Rds(off) is a resistance of a switch connecting the inductor to one of ground and a negative supply, and Rdcr is a DC resistance value of the inductor.

In some example embodiments, k may be a ratio of an internal capacitance of a device to an external inductance.

"Circuitry," as used in any embodiment herein, may comprise, for example, singly or in any combination, hardwired circuitry, programmable circuitry, state machine circuitry, and/or firmware that stores instructions executed by programmable circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A method for simulating an inductor current, comprising:
   utilizing a pulse width modulation signal to control a switch in voltage converter circuitry to cause an inductor in the voltage converter circuitry to be coupled to a positive supply when the switch is closed and decoupled from the positive supply when the switch is open;
   controlling track and hold circuitry in control circuitry to provide an inductor input voltage to an operational amplifier in the control circuitry when the pulse width modulation signal causes the switch to close;
   controlling the track and hold circuitry to stop providing the inductor input voltage to the operational amplifier when the pulse width modulation signal causes the switch to open; and
   simulating an inductor current when the switch is open by generating a voltage proportionate to the inductor current using at least a current source and a capacitor in the control circuitry, wherein the current source is controlled based at least on a resistance of the switch and an output voltage of the converter circuitry.

2. The method of claim 1, wherein the current source is also controlled based on a proportionality constant.

3. The method of claim 1, further comprising:
   using the operational amplifier to compare the voltage proportionate to the inductor current to a reference voltage; and
   generating a low drop-out current to supplement the inductor current based on a result of the comparison using a voltage controlled current source in the control circuitry.

4. The method of claim 1, wherein the current source is controlled according to:

$$I=k*R_{ds(on)}*Vout+c$$

where k is a constant,
$R_{ds(on)}$ is a resistance of a switch connecting the inductor to the positive supply,
Vout is an output voltage, and
c is a constant.

5. The method of claim 4, wherein c is calculated according to:

$$c=k*R_{ds(on)}*I_L*(R_{ds(off)}+Rdcr)$$

where $I_L$ is a constant approximating an average inductor current,
$R_{ds(off)}$ is a resistance of a switch connecting the inductor to one of ground and a negative supply, and
Rdcr is a DC resistance value of the inductor.

6. A device for simulating an inductor current, comprising:
   voltage converter circuitry including at least a switch to cause an inductor in the voltage converter circuitry to be coupled to a positive supply when the switch is closed and decoupled from the positive supply when the switch is open based on a pulse width modulation signal; and control circuitry including:
track and hold circuitry to provide an inductor input voltage to an operational amplifier in the control circuitry when the pulse width modulation signal causes the switch to close, and stop providing the inductor input voltage to the operational amplifier when the pulse width modulation signal causes the switch to open; and a current source and a capacitor to simulate an inductor current when the switch is open by generating a voltage proportionate to the inductor current, wherein the current source is controlled based at least on a resistance of the switch and an output voltage of the converter circuitry.

7. The device of claim 6, wherein the current source is also controlled based on a proportionality constant.

8. The device of claim 6, wherein the control circuitry further comprises a voltage controlled current source, the operational amplifier is to compare the voltage proportionate to the inductor current to a reference voltage, and the voltage controlled current source is to generate a low drop-out current to supplement the inductor current based on a result of the comparison.

9. The device of claim 6, wherein the current source is controlled according to:

$$I = k * R_{ds(on)} * Vout + c$$

where k is a constant,
$R_{ds(on)}$ is a resistance of a switch connecting the inductor to the positive supply,
Vout is an output voltage, and
c is a constant.

10. The device of claim 9, wherein c is calculated according to:

$$c = k * R_{ds(on)} * I_L * (R_{ds(off)} + Rdcr)$$

where $I_L$ is a constant approximating an average inductor current,
$R_{ds(off)}$ is a resistance of a switch connecting the inductor to one of ground and a negative supply, and
Rdcr is a DC resistance value of the inductor.

11. Control circuitry for simulating an inductor current, comprising:
an operational amplifier;
track and hold circuitry to provide an inductor input voltage from an inductor in voltage converter circuitry to the operational amplifier when a pulse width modulation signal causes a switch in the voltage converter circuitry to close, and stop providing the inductor input voltage to the operational amplifier when the pulse width modulation signal causes the switch to open; and a current source and a capacitor to simulate an inductor current when the switch is open by generating a voltage proportionate to the inductor current, wherein the current source is controlled based at least on a resistance of the switch and an output voltage of the converter circuitry.

12. The system of claim 11, wherein the current source is also controlled based on a proportionality constant approximately equal to a proportionality constant of the sample voltage on the capacitor when the inductor is connected to a positive supply.

13. The system of claim 11, wherein the current source is controlled according to:

$$I = k * R_{ds(on)} * Vout + c$$

where k is a constant,
$R_{ds(on)}$ is a resistance of a switch connecting the inductor to the positive supply,
Vout is an output voltage, and
c is a constant.

14. The system of claim 13, wherein c is calculated according to:

$$c = k * R_{ds(on)} * I_L * (R_{ds(off)} + Rdcr)$$

where $I_L$ is a constant approximating an average inductor current,
$R_{ds(off)}$ is a resistance of a switch connecting the inductor to one of ground and a negative supply, and
Rdcr is a DC resistance value of the inductor.

15. The system of claim 11, further comprising:
a buck converter connected to the inductor.

16. The system of claim 11, further comprising:
a voltage controlled current source is to generate a low drop-out current to supplement the inductor current based on an output of the operational amplifier.

* * * * *